(12) United States Patent
Aruga et al.

(10) Patent No.: US 7,858,509 B2
(45) Date of Patent: Dec. 28, 2010

(54) HIGH-DIELECTRIC FILM SUBSTRATE PROCESSING METHOD

(75) Inventors: Miki Aruga, Nirasaki (JP); Kazuyoshi Yamazaki, Richardson, TX (US); Shintaro Aoyama, Nirasaki (JP); Kouji Shimomura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 199 days.

(21) Appl. No.: 12/088,940

(22) PCT Filed: Apr. 25, 2007

(86) PCT No.: PCT/JP2007/058955
§ 371 (c)(1), (2), (4) Date: Apr. 2, 2008

(87) PCT Pub. No.: WO2007/129579
PCT Pub. Date: Nov. 15, 2007

(65) Prior Publication Data
US 2008/0254644 A1    Oct. 16, 2008

(30) Foreign Application Priority Data
May 2, 2006    (JP) .............................. 2006-128564

(51) Int. Cl.
*H01L 21/3205* (2006.01)
(52) U.S. Cl. ..................... 438/591; 438/775; 438/778; 438/791; 438/E21.636

(58) Field of Classification Search .................. 438/591, 438/775–778, 791
See application file for complete search history.

(56) References Cited

U.S. PATENT DOCUMENTS

2005/0106896 A1* 5/2005 Fukuchi ....................... 438/778
2005/0282400 A1* 12/2005 Xiao et al. ................... 438/778

FOREIGN PATENT DOCUMENTS

| JP | 2004 253777 | 9/2004 |
| JP | 2006 40977 | 2/2006 |
| WO | 03 049173 | 6/2003 |

* cited by examiner

*Primary Examiner*—Dung A. Le
(74) *Attorney, Agent, or Firm*—Oblon, Spivak, McClelland, Maier & Neustadt, L.L.P.

(57) ABSTRACT

A disclosed substrate processing method in a single wafer substrate processing device including a first process position for introducing nitrogen atoms to a high-dielectric film and a second process position for performing heat treatment on the high-dielectric film includes: successively conveying plural substrates to be processed to the first process position and the second process position one by one; and successively performing the introduction of nitrogen atoms and the heat treatment on the high-dielectric film on the substrates to be processed, wherein the treatment on the substrate to be processed is started within 30 seconds at the second process position after the process at the first position.

5 Claims, 16 Drawing Sheets

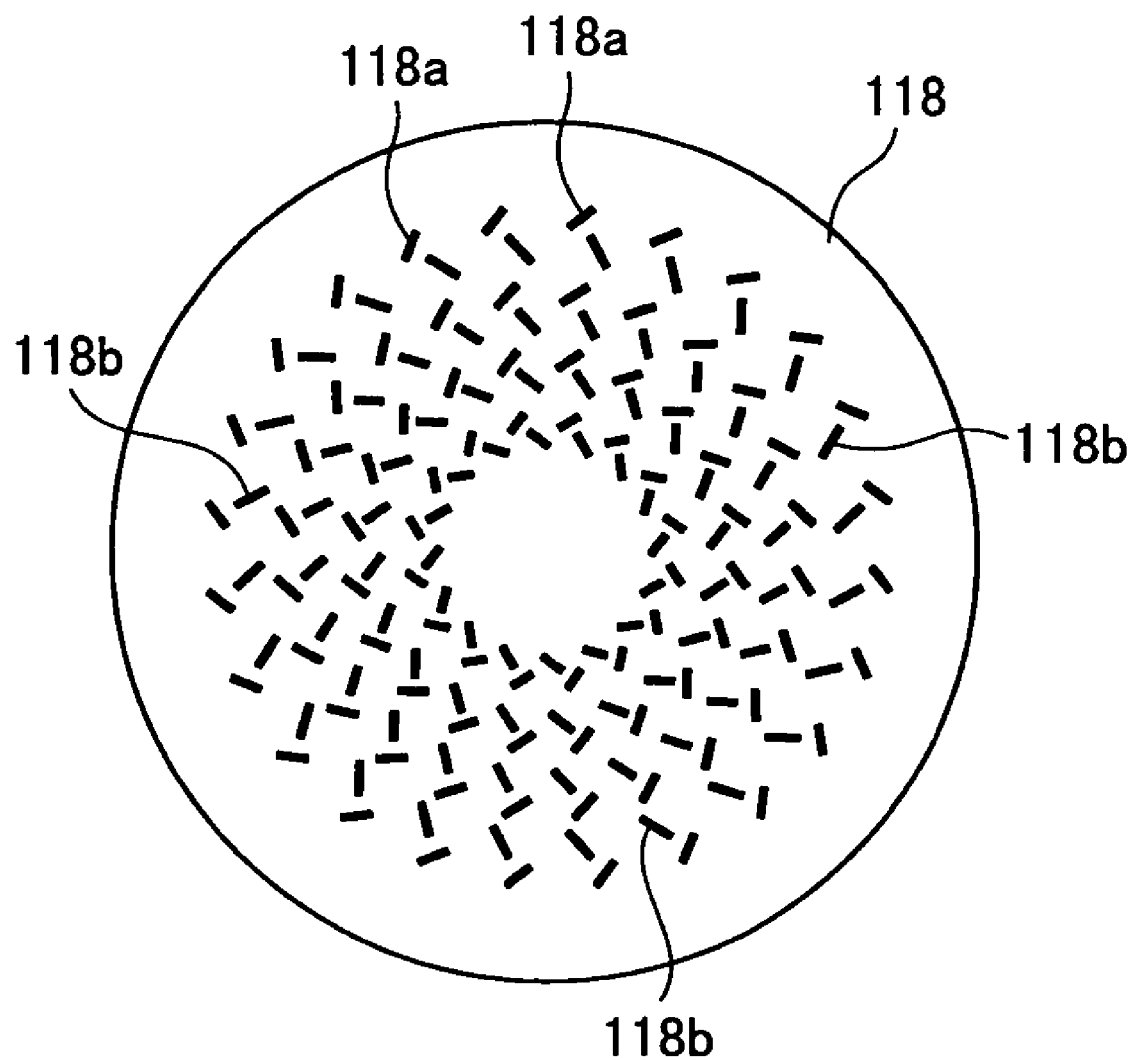

HIGH-DIELECTRIC FILM SUBSTRATE PROCESSING METHOD

TECHNICAL FIELD

The present invention generally relates to a film formation technique and more particularly to a method for manufacturing a semiconductor device using a high dielectric film referred to as a high-K film, for example.

BACKGROUND ART

Nowadays, with the advancement of miniaturization techniques, it is possible to manufacture ultrafine and ultrafast semiconductor devices having a gate length of less than 0.1 μm.

In those ultrafine and ultrafast semiconductor devices, as a gate length is reduced, a film thickness of a gate oxide film needs to be reduced in accordance with the scaling law. In the semiconductor devices having a gate length of less than 0.1 μm, when a conventional thermally-oxidized film is used, the film thickness of the gate oxide film needs to be set from 1 to 2 nm or less. However, in such a very thin gate insulator, tunneling current is increased, so that a problem of increasing a gate leakage current is inevitable as a result.

In view of this, conventionally, there has been proposed a high dielectric material (so called a high-K film) such as $Ta_2O_5$, $Al_2O_3$, $ZrO_2$, $HfO_2$, $ZrSiO_4$, and $HfSiO_4$ applied to the gate insulator, in which a dielectric constant thereof is substantially greater then that of the thermally-oxidized film and thus an equivalent $SiO_2$ film thickness is small even though an actual film thickness is large. By using such a high dielectric material, it is possible to use a gate insulator having a physical film thickness of several nanometers even in an ultrafast semiconductor device having a very short gate length of not more than 0.1 μm and to reduce the gate leakage current resulting from the tunneling effect. In general, when such a high dielectric material is formed on a surface of a silicon substrate, the material has a polycrystalline structure.

When a high dielectric film is directly formed on the surface of the silicon substrate, a large-scale interdiffusion of Si atoms and metallic atoms is likely to be generated between the silicon substrate and the high dielectric film. In accordance with this, in general, the high dielectric film is formed on the surface of the silicon substrate via a very thin interfacial oxide film. On the other hand, there has been proposed a technique of directly forming the high dielectric film on the surface of the silicon substrate by selecting a material of the high dielectric film in recent years.

DISCLOSURE OF THE INVENTION

FIGS. 1A to 1C show steps of forming a $HfSiO_4$ film on a silicon substrate 1 via the interfacial oxide film according to a technique related to the present invention.

With reference to FIG. 1A, a dilute hydrofluoric acid (DHF) process is performed on the surface of the silicon substrate 1, so that a native oxide film is removed and a fresh silicon surface exposed by the removal is hydrogen-terminated at the same time.

Next, in the next step shown in FIG. 1B, typically through a radical oxidation process at from 400 to 500° C. by ultraviolet light excitation, a silicon oxide film 2 having a film thickness of about 0.4 nm is formed as an interfacial oxide film on the surface of the silicon substrate 1 subjected to the DHF process in this manner. And, in the step shown in FIG. 1C, a $HfSiO_4$ film 3A is formed to have a film thickness of several nanometers on the interfacial oxide film 2 typically at a substrate temperature of 480° C. by a CVD method in which tertiary-butoxy hafnium (HTB) and tetraethoxysilane (TEOS) are used as materials.

By contrast, FIGS. 2A and 2B show steps of directly forming a $HfSiO_4$ film 3B on the silicon substrate 1 by a CVD method according to another related technique in which TDEAH (hafnium tetrakisdiethylamide) and TDMAS (trisdimethylaminosilane) are used as materials.

With reference to FIG. 2A, the surface of the silicon substrate 1 is subjected to the DHF process in the same manner as in the step shown in FIG. 1A and a native oxide film is removed. Then, in the step shown in FIG. 2B, the CVD method is performed typically at a substrate temperature of 610° C. using TDEAH and TDMAS as materials, so that the $HfSiO_4$ film 3B is formed on the silicon substrate 2 so as to have a film thickness of several nanometers. In addition, when the formation of the $HfSiO_4$ film using the TDEAH and TDMAS as materials is performed on the silicon oxide film 2 as shown in FIG. 1C, surface roughness of the $HfSiO_4$ film to be formed is increased, so that the formation is directly performed on the silicon substrate 1 subjected to the DHF process as shown in FIG. 2A.

The $HfSiO_4$ film 3A formed in this manner has a reduced leakage current and properties superior as a gate insulator for an ultrafast semiconductor device.

On the other hand, when the high dielectric film such as the $HfSiO_4$ film formed in this manner is used for the gate insulator of a semiconductor device, preferably, nitrogen atoms are introduced into the film and heat treatment is performed so as to further improve electric characteristics such as leakage current characteristics and to reduce diffusion of a metallic element from a metallic film deposited as a gate electrode.

However, the inventors of the present invention have discovered in a basic research of the present invention that when the high dielectric film such as a HfSiON film into which nitrogen is introduced through nitriding treatment is held in the air, nitrogen atoms in the film are desorbed with passage of time and a nitrogen concentration is reduced.

It is a general object of the present invention to provide an improved and useful method for manufacturing a semiconductor device in which the above-mentioned problems are eliminated.

A more specific object of the present invention is to provide a method for manufacturing a semiconductor device that can reduce desorption of the nitrogen atoms from the high dielectric film in the method for manufacturing a semiconductor device including a step of performing heat treatment on the high dielectric film into which nitrogen is introduced.

Patent Document 1: WO03/049173

According to one aspect of the present invention, there is provided a substrate processing method in a single wafer substrate processing device including a first process position for introducing nitrogen atoms to a high-dielectric film and a second process position for performing heat treatment on the high-dielectric film, the substrate processing method comprising: successively conveying plural substrates to be processed to the first process position and the second process position one by one; and successively performing the introduction of nitrogen atoms and the heat treatment on the high-dielectric film on the substrates to be processed, wherein the treatment on the substrate to be processed is started within 30 seconds at the second process position after the process at the first position.

According to another aspect of the present invention, there is provided a computer-readable storage medium storing computer-readable software which, when executed by a general-purpose computer, causes the computer to control a single wafer substrate processing device including a first process position for introducing nitrogen atoms to a high-dielectric film and a second process position for performing heat treatment on the high-dielectric film, the computer-readable software causing the single wafer substrate processing device to perform substrate processing comprising: successively conveying plural substrates to be processed to the first process position and the second process position one by one; and successively performing the introduction of nitrogen atoms and the heat treatment on the high-dielectric film on the substrates to be processed, wherein the treatment on the substrate to be processed is started within 30 seconds at the second process position after the process at the first position.

According to another aspect of the present invention, there is provided a single wafer substrate processing device comprising: a first process position for introducing nitrogen atoms to a high-dielectric film; a second process position for performing heat treatment on the high-dielectric film; and a vacuum substrate conveying chamber connected to the first and second process positions, the single wafer substrate processing device successively conveying plural substrates to be processed to the first process position and the second process position one by one and performing the introduction of nitrogen atoms at the first process position and the heat treatment at the second process position on the high-dielectric film on the substrates to be processed, wherein the single wafer substrate processing device starts the treatment of the substrate to be processed at the second process position within 30 seconds after the process at the first position.

According to another aspect of the present invention, there is provided a substrate processing system comprising: a first single wafer substrate processing device including a first vacuum substrate conveying chamber and a film formation process chamber connected to the first vacuum substrate conveying chamber, the film formation process chamber forming a high-dielectric film on a substrate to be processed; and a second single wafer substrate processing device including a second vacuum substrate conveying chamber, a first process chamber connected to the second vacuum substrate conveying chamber, the first process chamber performing nitriding treatment on the high-dielectric film, and a second process chamber connected to the second vacuum substrate conveying chamber, the second process chamber performing heat treatment on the high-dielectric film, wherein in the second single wafer substrate processing device, plural substrates to be processed are successively conveyed to the first, second, and third process chambers one by one, the introduction of nitrogen atoms is performed on the high-dielectric film on the substrate to be processed in the first process chamber, the heat treatment is performed in the second process chamber, and a metal film is deposited on the high-dielectric film in the third process chamber, the high-dielectric film having been subjected to the heat treatment, and the single wafer substrate processing device starts the treatment of the substrate to be processed in the second process chamber within 30 seconds after the process in the first chamber.

According to the present invention, by controlling a period of time from the end of the nitriding treatment of the high-dielectric film to the start of the heat treatment to be within 30 seconds, it is possible to reduce the desorption of nitrogen atoms from the high-dielectric film and further increase a dielectric constant of the high-dielectric film from the introduction of nitrogen atoms. Moreover, through the introduction of nitrogen atoms, electric characteristics of the high-dielectric film are improved.

In addition, according to the present invention, after the high-dielectric film is formed on the substrate to be processed and the nitriding treatment and the nitriding treatment are performed, the steps up to the formation of the metal film are performed using two single wafer substrate processing devices. In this case, by performing from the nitriding treatment to the formation of the metal film using one single wafer substrate processing device, it is possible to have substantially the same number of film formation chambers in each single wafer substrate processing device and to improve an operation rate of an entire substrate processing system including the two single wafer substrate processing devices.

Other objects, features and advantage of the present invention will become more apparent from the following detailed description when read in conjunction with the accompanying drawings.

BRIEF DESCRIPTION OF THE DRAWINGS

FIG. 5B is a diagram showing a (second) structure of a microwave plasma processing device used in the present invention;

BEST MODE FOR CARRYING OUT THE INVENTION

Principle

Figure 1A:
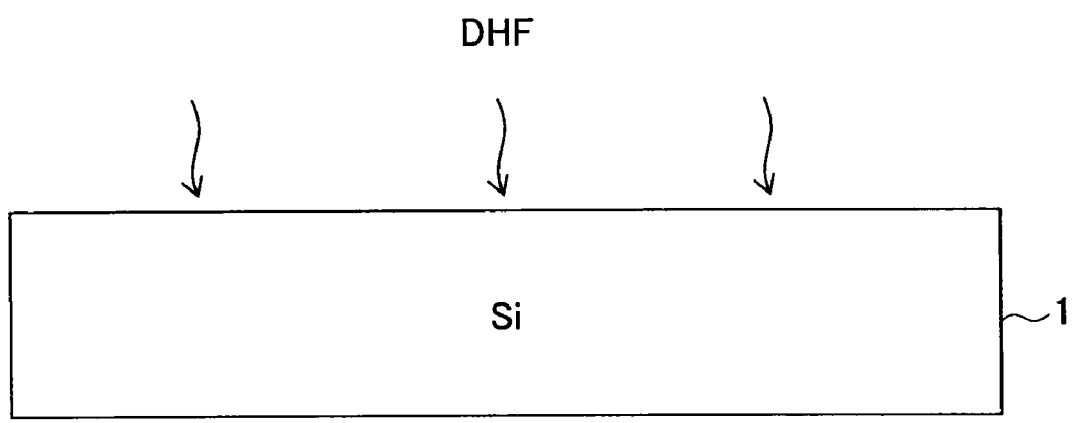
FIG. 1A is a diagram showing a (first) step of forming a high dielectric film according to a technique related to the present invention.
Figure 1B:
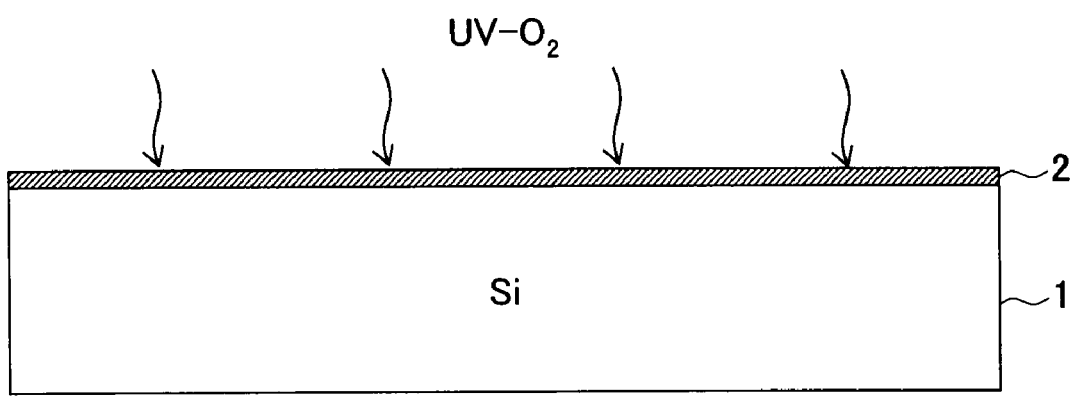
FIG. 1B is a diagram showing a (second) step of forming a high dielectric film according to a technique related to the present invention.
Figure 1C:
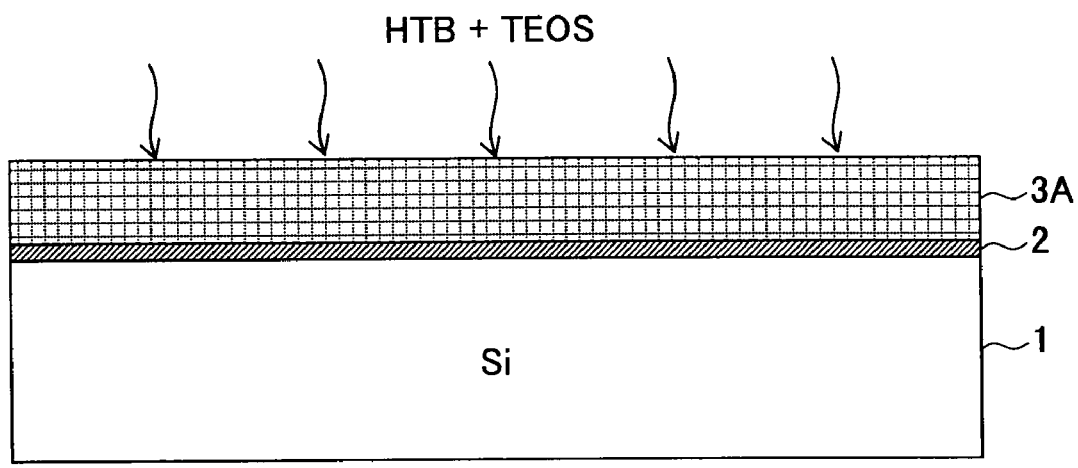
FIG. 1C is a diagram showing a (third) step of forming a high dielectric film according to a technique related to the present invention.

While the inventors of the present invention were conducting an experiment in the basic research of the present invention, where a HfSiO$_4$ film 13A formed in the step of FIG. 1C was nitrided through microwave plasma processing and the HfSiO$_4$ film (described as a HfSiON film) nitrided in this manner was subjected to heat treatment, the inventors discovered that a percentage of nitrogen atoms contained in the film after the heat treatment was reduced with passage of time after the HfSiO$_4$ film was subjected to the nitriding treatment until the heat treatment was started.

FIGS. 3A to 3E are diagrams illustrating the above-mentioned experiment by the inventors of the present invention.

Figure 3A:
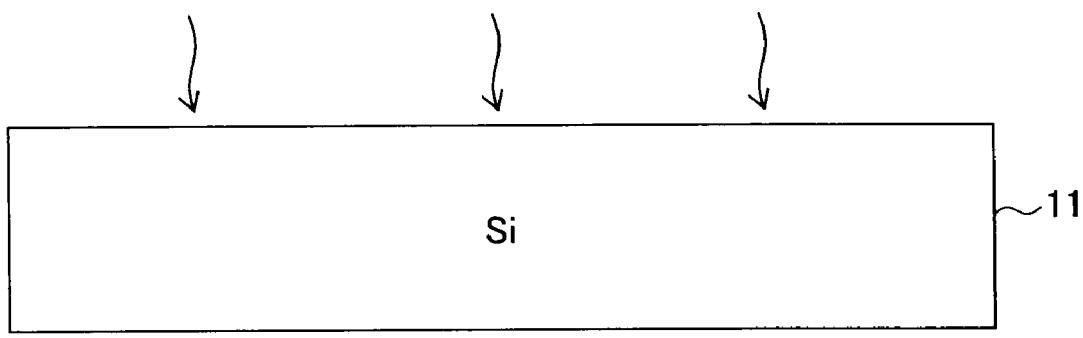
FIG. 3A is a diagram illustrating a (first) step of processing a substrate according to the present invention.

With reference to FIG. 3A, the dilute hydrofluoric acid (DHF) process is performed on a surface of a silicon substrate 11, so that a native oxide film is removed and a fresh silicon surface exposed by the removal is hydrogen-terminated at the same time.

Figure 3B:
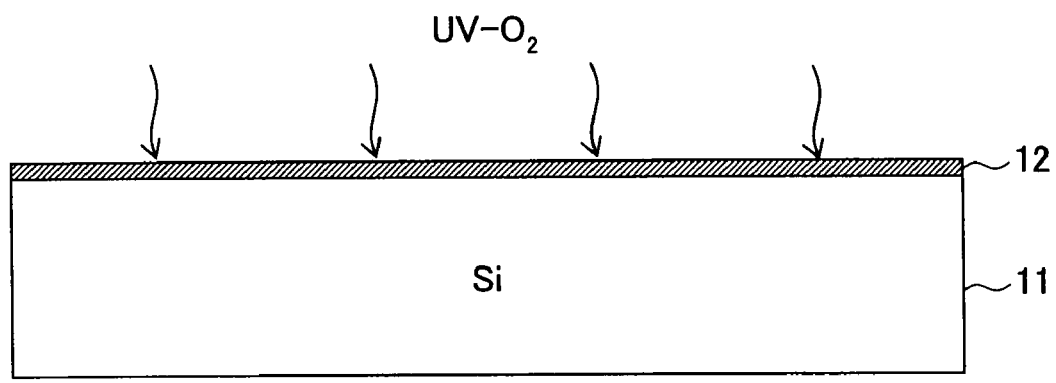
FIG. 3B is a diagram illustrating a (second) step of processing a substrate according to the present invention.

Next, in the next step shown in FIG. 3B, typically through the radical oxidation process at from 400 to 500° C. by ultraviolet light excitation, a silicon oxide film 12 having a film thickness of about 0.4 nm is formed as an interfacial oxide film on the surface of the silicon substrate 11 subjected to the DHF process in this manner. And, in the step shown in FIG. 3C, the HfSiO$_4$ film 13A is formed to have a film thickness of several nanometers, namely, 2 to 4 nm, for example, on the interfacial oxide film typically at a substrate temperature of 480° C. by the CVD method in which tertiary-butoxy hafnium (HTB) and tetraethoxysilane (TEOS) are used as materials.

Figure 3C:
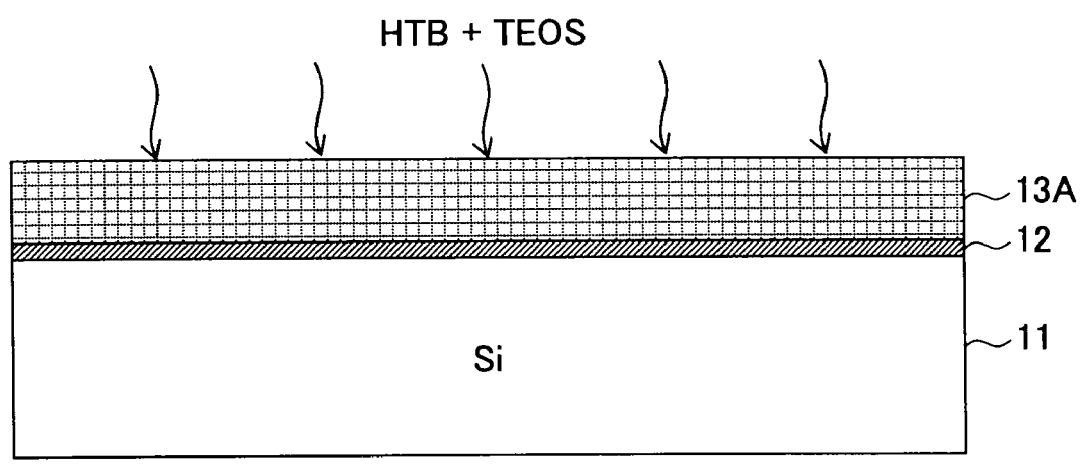
FIG. 3C is a diagram illustrating a (third) step of processing a substrate according to the present invention.
Figure 3D:
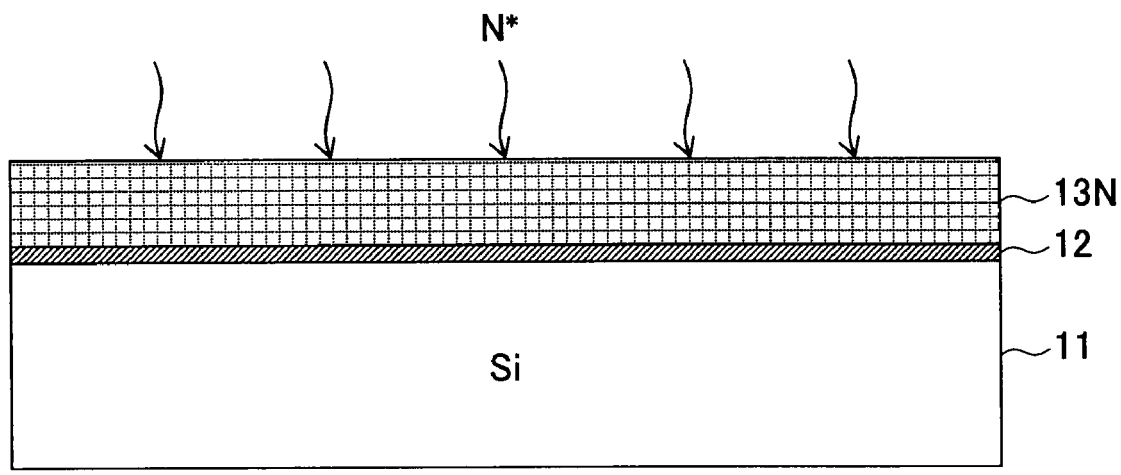
FIG. 3D is a diagram illustrating a (fourth) step of processing a substrate according to the present invention.

Further, in the step shown in FIG. 3D, the above-mentioned HfSiO$_4$ film 13A is exposed to plasma-excited nitrogen radical N* at a substrate temperature of 400° C., for example, a portion of oxygen atoms in the HfSiO$_4$ film 13A is substituted for nitrogen atoms, and the HfSiO$_4$ film 13A is substituted for a HfSiON film 13N. As mentioned above, the term "HfSiON film" represents a HfSiO$_4$ film in which a portion of oxygen atoms is substituted for nitrogen atoms and nitrogen is contained as a result.

Figure 3E:
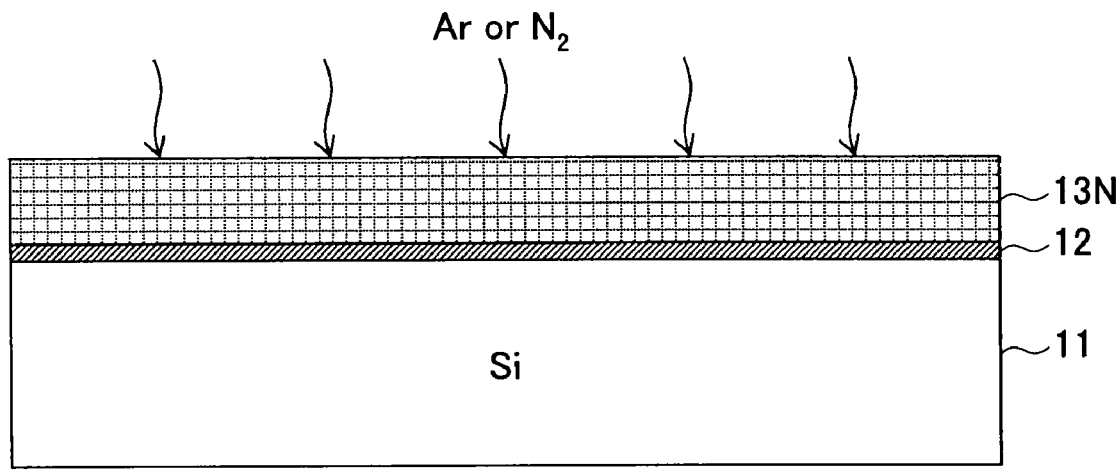
FIG. 3E is a diagram illustrating a (fifth) step of processing a substrate according to the present invention.

Further, in the step shown in FIG. 3E, the above-mentioned structure is subjected to heat treatment at a temperature of 700° C., for example, in Ar or nitrogen atmosphere. In accordance with such a heat treatment step, defects in the HfSiON film 13N are repaired and quality of the film is improved.

Figure 4:
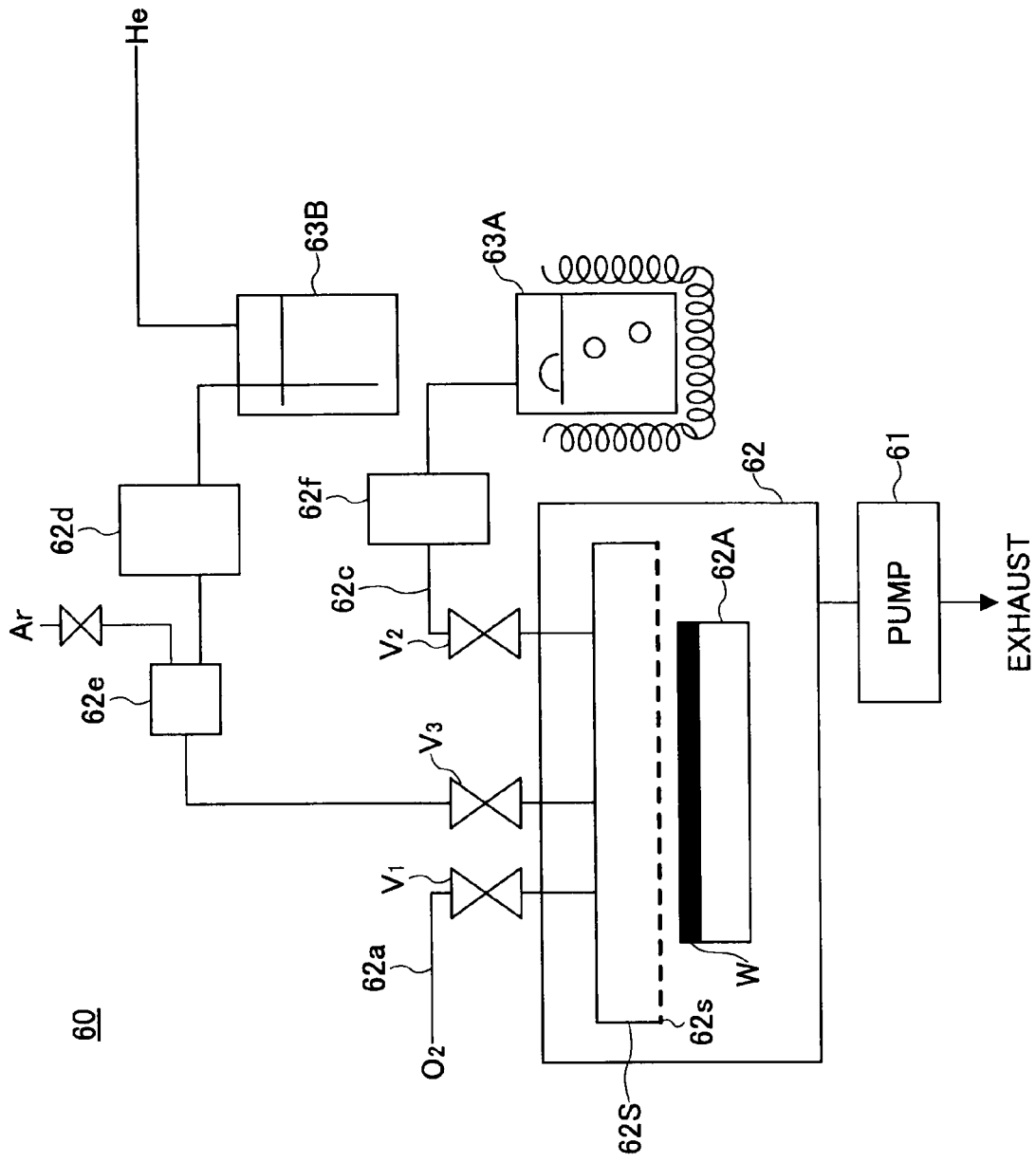
FIG. 4 is a diagram showing an MOCVD device used in the present invention.
Figure 5A:
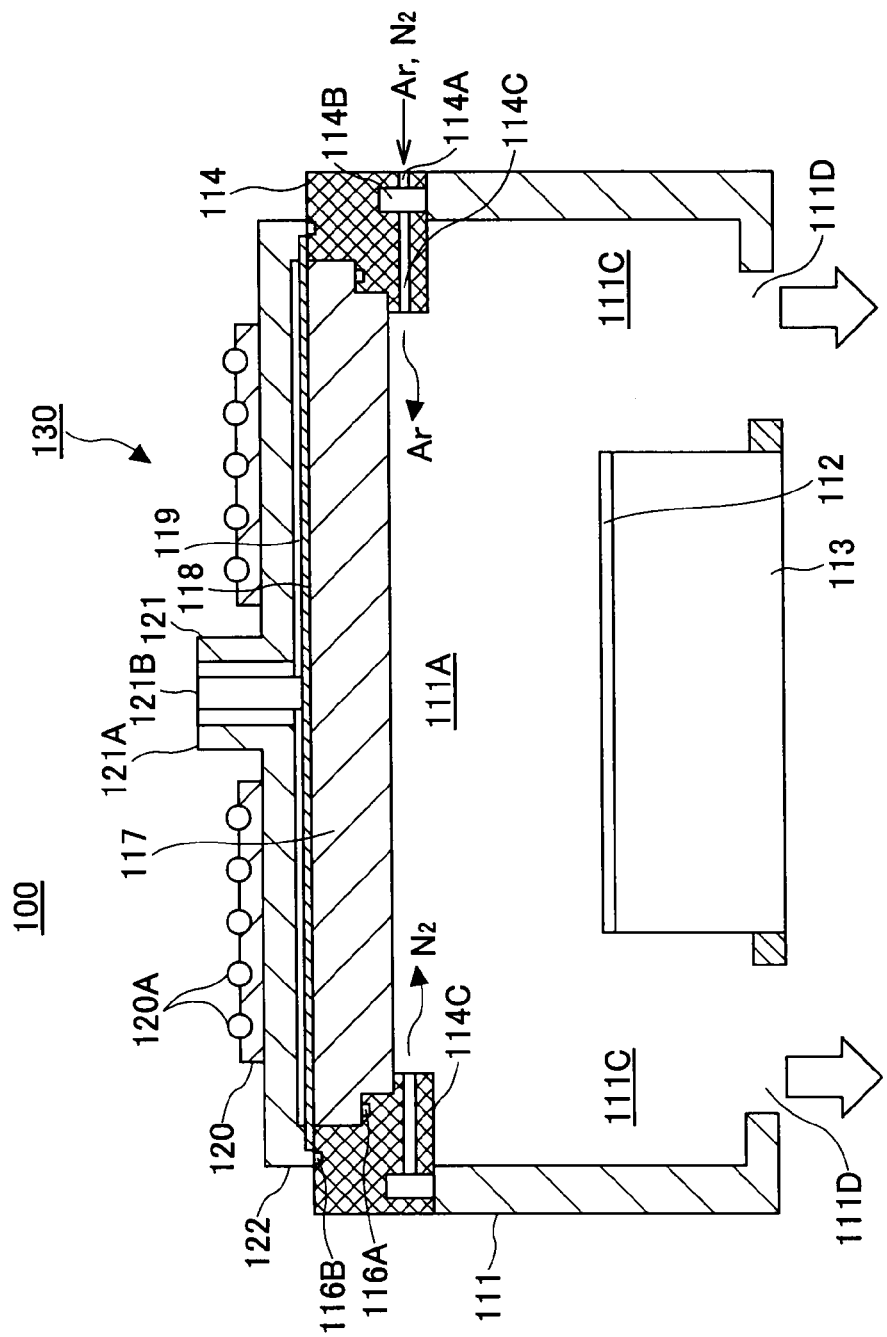
FIG. 5A is a diagram showing a (first) structure of a microwave plasma processing device used in the present invention.

FIG. 4 shows a structure of an MOCVD device 60 used by the inventors of the present invention so as to form the HfSiO$_4$ film 13A in the above-mentioned research. FIGS. 5A and 5B show structures of a plasma nitriding device 100 used by the inventors of the present invention so as to nitride the HfSiO$_4$ film 13A.

With reference to FIG. 4, the MOCVD device 60 includes a process container 62 exhausted by a pump 61. A holding stage 62A holding a substrate W to be processed is disposed inside the process container 62.

In the process container 62, a shower head 62S is disposed so as to face the substrate W to be processed and a line 62a supplying oxygen gas is connected to the shower head 62S via an MFC (mass flow controller) not shown in the drawings and a valve V1.

The MOCVD device 60 includes a container 63B holding an organometallic compound material such as tertiary-butyl hafnium (HTB) and the organometallic compound material in the container 63B is supplied to a vaporizer 62e via a fluid flow controller 62d in accordance with a pressure feed gas such as He gas and an organometallic compound material gas vaporized by the vaporizer 62e with assistance of a carrier gas such as Ar is supplied to the shower head 62S via a valve V3.

The MOCVD device 60 further includes a heating container 63A holding an organic silicon compound material such as TEOS and an organic silicon compound material gas vaporized by the heating container 63A is supplied to the shower head 62S via an MFC 62b and a valve V2.

The oxygen gas, organic silicon compound material gas, and organometallic compound material gas pass through each path in the shower head 62S and are injected into a process space in the process container 62 from an opening 62s formed on a surface of the shower head 62S facing the silicon substrate W.

In view of this, in the above-mentioned experiment, the silicon substrate 11 in the status shown in FIG. 3B, where the interfacial oxide film 12 has a film thickness of 0.4 nm, for example, is introduced to the process container 62 and is held on the holding stage 62A as the substrate W to be processed, an internal pressure of the process container 62 is set to 40 Pa and a substrate temperature is set to 480° C., and the HTB is introduced from the shower head 62S at a flow rate of 0.2 SCCM and the TEOS at a flow rate of 0.2 SCCM, thereby forming the HfSiO$_4$ film 13A on the silicon substrate 11 so as to have a film thickness of 2 to 4 nm in the step shown in FIG. 3C.

FIGS. 5A and 5B show the microwave plasma processing device 100 used to nitride the HfSiO$_4$ film shown in FIG. 3C and substitute the film for the HfSiON film in the step shown in FIG. 3D.

With reference to FIG. 5A, the microwave plasma processing device 100 includes a process container 111 exhausted from plural exhaust ports 111D. In the process container 111, a holding stage 113 holding a substrate 112 to be processed is formed. In order to realize uniform exhaust of the process container 111, a space 111C is formed into a ring-like shape around the holding stage 113. By forming the plural exhaust port 111D so as to communicate with the space 111C, it is possible to uniformly exhaust the process container 111 via the space 111C and the exhaust port 111D.

On the process container 111, a ceramic cover plate 117 made of a low-loss dielectric material is formed via a seal ring 116A as a portion of an outer wall of the process container 111 at a position for the substrate 112 to be processed on the holding stage 113 so as to face the substrate 112 to be processed.

The cover plate 117 is seated on a ring-shaped member 114 disposed on the process container 111 via the seal ring 116A and a gas path 114B communicating with a gas supply port 114A and having a ring-like shape corresponding to the ring-shaped member 114 is formed in the ring-shaped member 114. Further, in the ring-shaped member 114, plural gas inlets 114C communicating with the gas path 114B are formed in an axisymmetric manner relative to the substrate 112 to be processed.

Gases such as Ar, Kr, Xe, H$_2$, and the like supplied to the gas supply port 114A is supplied from the gas path 114B to the gas inlet 114C and are injected from the gas inlet 114C into a space 111A immediately below the cover plate 117 in the process container 111.

On the process container 111, a radial line slot antenna 130 having a radiation surface shown in FIG. 4(B) is disposed on the cover plate 117 with a space from the cover plate 117 from 4 to 5 mm.

The radial line slot antenna 130 is seated on the ring-shaped member 114 via a seal ring 116B and is connected to an external microwave source (not shown in the drawings) via a coaxial waveguide 121. The radial line slot antenna 130 excites plasma gas injected into the space 111A using microwaves from the microwave source.

The radial line slot antenna 130 includes a flat disk-shaped antenna body 122 connected to an outer waveguide 121A of the coaxial waveguide 121 and a radiation plate 118 formed at an opening of the antenna body 122, where multiple slots 118a and multiple slots 118b orthogonal to one another shown in FIG. 5B are formed. A slow-wave plate 119 made of a dielectric plate having a constant thickness is inserted between the antenna body 122 and the radiation plate 118. A central conductor 121B constituting the coaxial waveguide 121 is connected to the radiation plate 118. A cooling block 120 including a cooling path 120A is disposed on the antenna body 122.

In the radial line slot antenna 130 having such a structure, microwaves fed from the coaxial waveguide 121 transmit between the disk-shaped antenna body 122 and the radiation plate 118 while spreading in a radial direction. In this case, wavelength is compressed due to an effect of the slow-wave plate 119. In view of this, by concentrically forming the multiple slots 118a and 118b so as to be orthogonal to one another in accordance with the wavelength of the microwaves transmitting in the radial direction in this manner, it is possible to radiate plane waves having circularly polarized waves in a direction substantially orthogonal to the radiation plate 118.

By using the radial line slot antenna 130, high-density plasma is uniformly formed in the space 111A immediately below the cover plate 117. The high-density plasma formed in this manner has a low electron temperature, so that no damage is generated on the substrate 112 to be processed or no metallic contamination resulting from sputtering of the wall of the process container 111 is generated.

In the process chamber 83, the silicon substrate 11 in the status shown in FIG. 1C where the $HfSiO_4$ film 13A is formed is held at a temperature of 250° C., for example, as the substrate 112 to be processed on the holding stage 113. Nitrogen gas and Ar gas are supplied to the process container 111 at the same time and nitrogen radical N* is generated in accordance with plasma exciting of Ar. The nitrogen radical N* formed in this manner affects the $HfSiO_4$ film on the silicon substrate 21 to substitute a portion of oxygen atoms and transform the film into a HfSiON film.

In the microwave plasma processing device shown in FIGS. 5A and 5B, the electron temperature of the plasma is as low as several electron volts, so that even when such a plasma process is performed, an electric charge does not enter the $HfSiO_4$ film.

Figure 6:
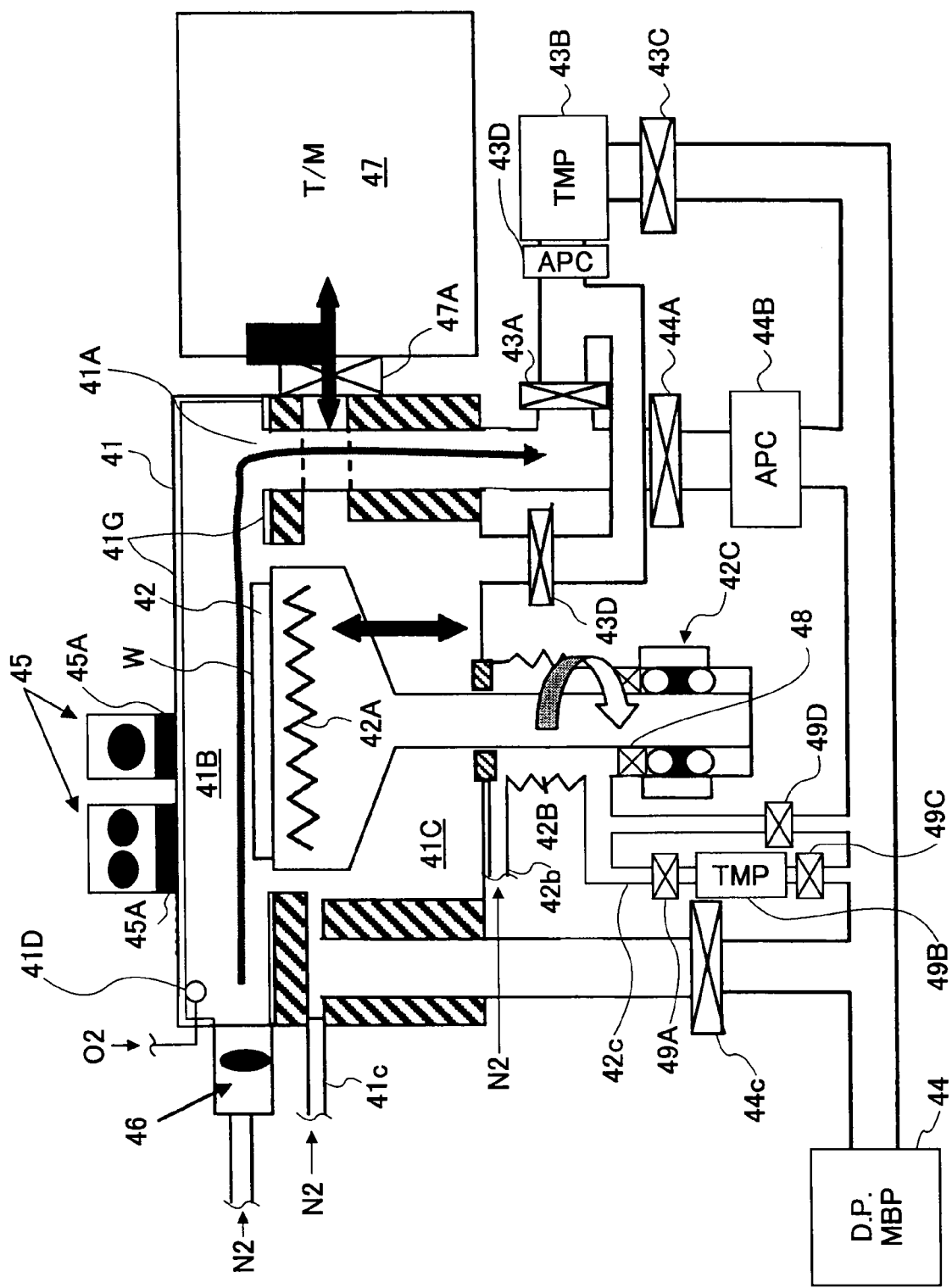
FIG. 6 is a diagram showing a structure of an oxidation treatment device used in the present invention.

FIG. 6 shows a schematic structure of a substrate processing device 40 used by the inventors of the present invention so as to form the interfacial oxide film 12 on the silicon substrate 11 in the step shown in FIG. 3B in the above-mentioned research.

With reference to FIG. 6, the substrate processing device 40 houses a substrate holding stage 42 including a heater 42A, the substrate holding stage 42 being disposed in a vertically movable manner between a process position and a substrate carrying in/out position. The substrate processing device 40 includes a process container 41 defining a process space 41B together with the substrate holding stage 42 and the substrate holding stage 42 is rotated by a driving mechanism 42C. An inner wall of the process container 41 is covered with an inner liner 41G made of silica glass, so that metallic contamination of the substrate to be processed from an exposed metallic surface is reduced to not more than $1 \times 10^{10}$ atom/cm$^2$ level.

Further, a magnetic seal 48 is formed on a connected portion between the substrate holding stage 42 and the driving mechanism 42C and the magnetic seal 48 separates a magnetic seal chamber 42B held in a vacuum environment from the driving mechanism 42C formed in an atmospheric environment. The magnetic seal 48 per se is a liquid, so that the substrate holding stage 42 is rotatably held.

In the status shown in the figure, the substrate holding stage 42 is at the process position and a carrying in/out chamber 41C for carrying in/out the substrate to be processed is formed below the substrate holding stage 42. The process container 41 is connected to a substrate conveying unit 47 via a gate valve 47A such that when the substrate holding stage 42 is lowered in the carrying in/out chamber 41C, the substrate W to be processed is conveyed to the substrate holding stage 42 from the substrate conveying unit 27 via the gate valve 47A and the processed substrate W is conveyed to the substrate conveying unit 47 from the substrate holding stage 42.

In the substrate processing device 40 shown in FIG. 6, an exhaust opening 41A is formed at a position close to the gate valve 47A of the process container 41 and a turbo-molecular pump 43B is connected to the exhaust opening 41A via a valve 43A and an APC (automatic pressure control device) 44B. A pump 44 constructed by connecting a dry pump to a mechanical booster pump is connected to the turbo-molecular pump 43B via a valve 43C. By driving the turbo-molecular pump 43B and the dry pump 44, it is possible to reduce pressure on the process space 41B to $1.33 \times 10^{-1}$ to $1.33 \times 10^{-4}$ Pa($10^{-3}$ to $10^{-6}$ Torr).

On the other hand, the exhaust opening 41A is directly connected to the pump 44 via a valve 44A and the APC 44B. By releasing the valve 44A, the pressure on the process space is reduced by the pump 44 to 1.33 Pa to 1.33 kPa(0.01 to 10 Torr).

On the process container 41, a process gas supply nozzle 41D is disposed on the opposite side of the exhaust opening 41A across the substrate W to be processed, the process gas supply nozzle 41D supplying oxygen gas and the TDEAH from each line. The oxygen or TDEAH gas supplied to the process gas supply nozzle 41D is flown along with a surface of the substrate W to be processed in the process space 41B and is exhausted from the exhaust opening 41A.

In order to generate oxygen radical by activating the process gas or the oxygen gas in particular supplied from the process gas supply nozzle 41D, in the substrate processing device 40 of FIG. 6, an ultraviolet light source 45 is disposed on the process container 41, the ultraviolet light source 45 having a quartz window 45A for an area between the process gas supply nozzle 41D and the substrate W to be processed. However, in the experiment, the ultraviolet light source 45 is not used. Further, in the process container 41, a remote plasma source 46 is formed on the opposite side of the exhaust opening 41A relative to the substrate W to be processed. However, in the experiment, the remote plasma source 46 is not used.

In the substrate processing device 40 of FIG. 6, a purge line 41c purging the carrying in/out chamber 41C using nitrogen gas is further disposed and a purge line 42b purging the magnetic seal chamber 42B using nitrogen gas and an exhaust line 42c thereof are further disposed.

Specifically, a turbo-molecular pump 49B is connected to the exhaust line 42c via a valve 49A and the turbo-molecular pump 49B is connected to the pump 44 via a valve 49C. Further, the exhaust line 42c is directly connected to the pump 44 via a valve 49D, so that it is possible to maintain the magnetic seal chamber 42B to have various pressures.

The carrying in/out chamber 41C is exhausted by the pump 44 via a valve 44C or exhausted by the turbo-molecular pump 43B via a valve 43D. In order to avoid generation of contamination in the process space 41B, the carrying in/out chamber 41C is maintained to have pressure lower than in the process space 41B and the magnetic seal chamber 42B is maintained to have pressure further lower than in the carrying in/out chamber 41C by being differentially pumped.

Moreover, in the heat treatment step shown in FIG. 3E, a heat treatment device of a normal lamp heating type not shown in the drawings is used so as to perform rapid thermal processing (RTP) in Ar or nitrogen atmosphere at a substrate temperature of 600 to 700° C.

Figure 7:
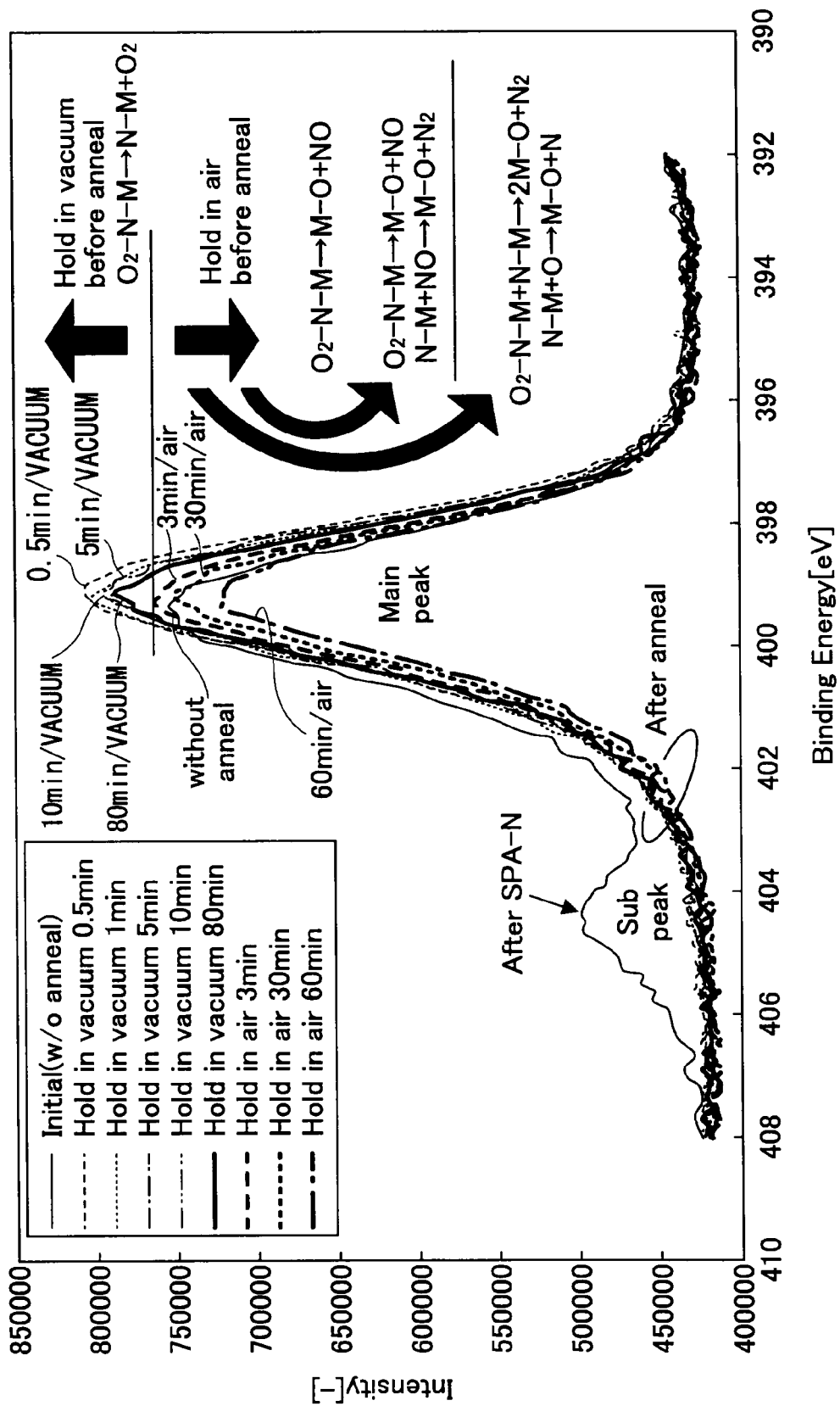
FIG. 7 is a diagram illustrating a principle of the present invention.

FIG. 7 shows an XPS spectrum of $N_{1S}$ orbital in the HfSiON film 13N obtained in the steps shown in FIGS. 3A to 4E while varying time to proceed from the step shown in FIG. 3D to the step shown in FIG. 3E. In addition, FIG. 7 shows a case for reference ("without anneal") where the step shown in FIG. 3E is omitted. In this case, a status of nitrogen atoms in the film immediately after the nitriding treatment in FIG. 3D is shown.

With reference to FIG. 7, it is understood that by performing the heat treatment shown in FIG. 3E, the nitrogen atoms introduced to an irregular site in the film are settled in a regular site having a binding energy of about 399 eV and a subpeak which had been present at a position having a binding energy of about 404.5 eV has disappeared. On the other hand, it is understood that as the time from the step shown in FIG. 3C to the step shown in FIG. 3D is increased, the peak becomes lower and the nitrogen atoms in the film are desorbed.

In FIG. 7, "hold in vacuum before anneal" indicates a case where the structure of FIG. 3D is held in vacuum until the heat treatment step shown in FIG. 3E after the nitriding step shown in FIG. 3D. Further, "hold in air before anneal" indicates a case where the structure of FIG. 3D is held in the air until the heat treatment step shown in FIG. 3E after the nitriding step shown in FIG. 3D.

Figure 8:
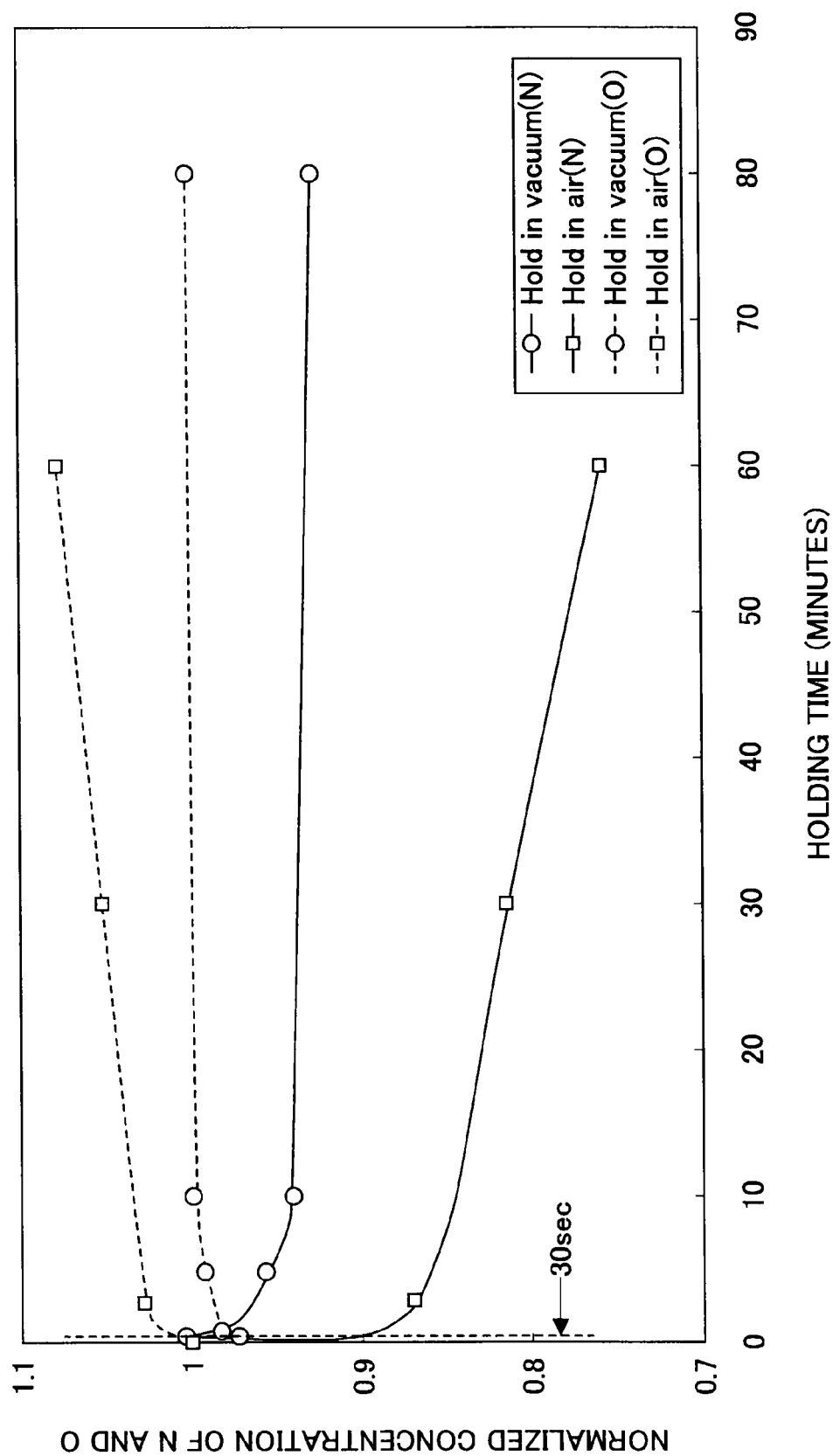
FIG. 8 is another diagram illustrating a principle of the present invention.

FIG. 8 shows a relationship between nitrogen concentration and oxygen concentration in the HfSiON film 13N and holding time in the air or in vacuum from the step of FIG. 3D to the step of FIG. 3E based on data shown in FIG. 8. In FIG. 8, the nitrogen concentration and the oxygen concentration in the film are normalized based on a status immediately after the nitriding treatment step. In the figure, a solid line with ○ indicates the nitrogen concentration in the film when the structure of FIG. 3D is held in the vacuum environment, a solid line with □ indicates the nitrogen concentration in the film when the structure of FIG. 3D is held in the air, a broken line with ○ indicates the oxygen concentration in the film when the structure of FIG. 3D is held in the air, and a broken line with □ indicates the oxygen concentration in the film when the structure of FIG. 3D is held in the air.

With reference to FIG. 8, the nitrogen concentration in the HfSiON film 13N is reduced in accordance with the holding time in both cases where the structure is held in vacuum and where the structure is held in the air. On the other hand, the oxygen concentration in the HfSiON film 13N is increased in accordance with the holding time in both cases where the structure is held in vacuum and where the structure is held in the air. This suggests that oxygen atoms contained in the environment infiltrate into the HfSiON film 13N and exclude nitrogen atoms. It must be noted that even in a vacuum environment, if a degree of vacuum is about that of a normal vacuum substrate conveying chamber, a substantial amount of oxygen exists in the environment.

Such a phenomenon may result from a mechanism in which when oxygen in the environment infiltrate into the HfSiON film, the oxygen is bonded to Hf atoms and nitrogen atoms which have been bonded to the Hf atoms are excluded. In this case, such a phenomenon is considered to occur not only in the HfSiON film but also in other metal oxynitride film and a metal silicate film containing nitrogen, such as YON film, LaON film, YSiON film, HfON film, ZrSiON film, ZrON film, and the like used as a high-K film.

With reference to FIG. 8 again, it is understood that when the holding time, namely, the time from an end of the step of FIG. 3D to a start of the step of FIG. 3E is within 30 seconds in vacuum, it is possible to substantially reduce desorption of nitrogen atoms.

In view of this, in the present invention, in the film formation steps of FIG. 3A to FIG. 3E, the desorption of nitrogen atoms from a high dielectric film such as nitrided HfSiON is reduced by controlling the time from the end of the nitriding treatment step of FIG. 3D to the start of the heat treatment step of FIG. 3E within thirty seconds.

First Embodiment

Figure 9:
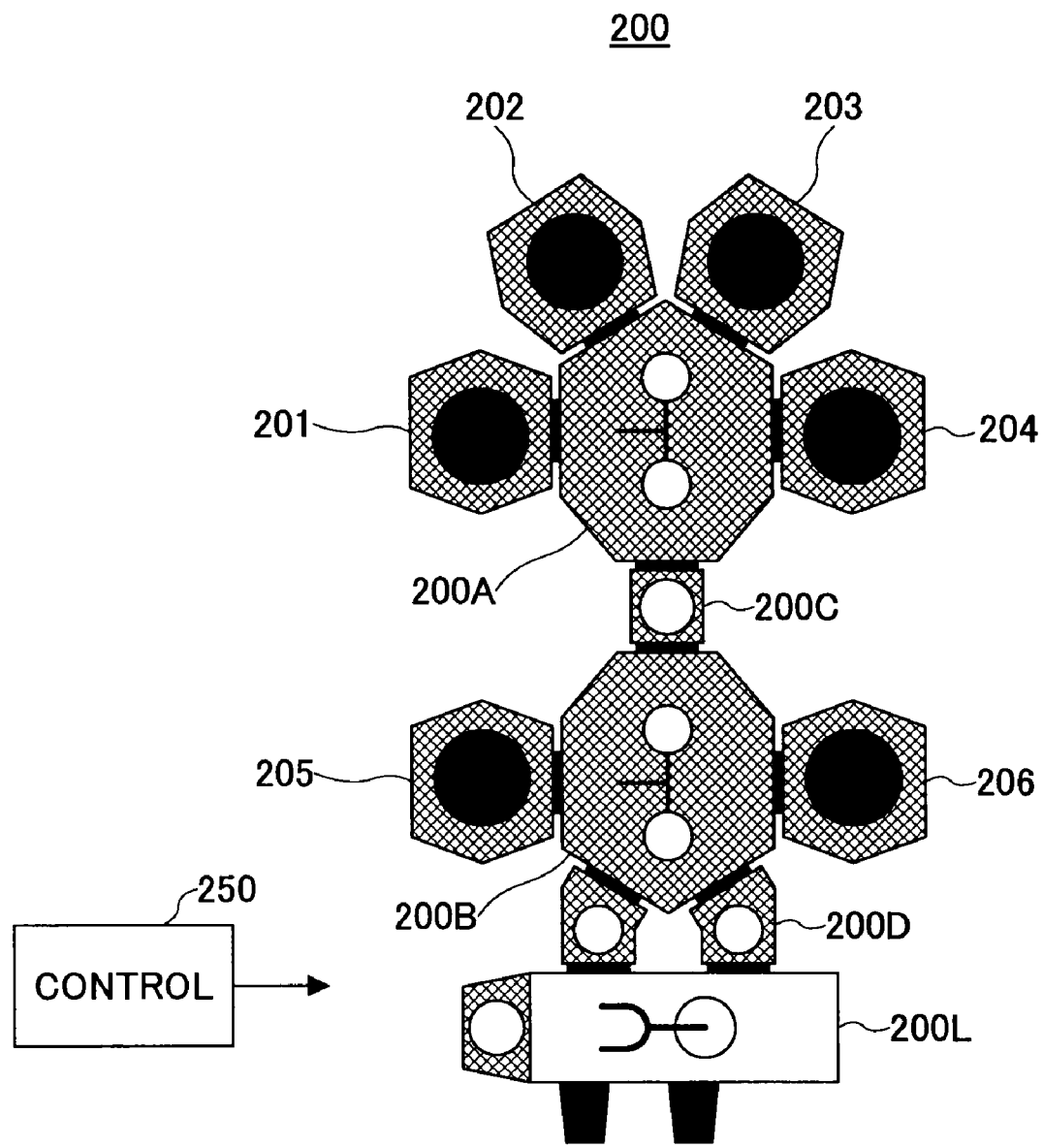
FIG. 9 is a diagram showing a structure of a substrate processing device used in a first embodiment of the present invention.

FIG. 9 shows a structure of a cluster-type substrate processing system 200 used in a first embodiment of the present invention.

With reference to FIG. 9, the cluster-type substrate processing system 200 includes a load lock chamber 200L and vacuum substrate conveying chambers 200A and 200B connected thereto. In the vacuum substrate conveying chambers 200A and 200B, substrate conveying robots are disposed.

Further, the vacuum substrate conveying chamber 200B is connected to the load lock chamber 200L via a vacuum substrate conveying chamber 200D and the vacuum substrate conveying chamber 200A is connected to the vacuum substrate conveying chamber 200B via a vacuum substrate conveying chamber 200C.

The vacuum substrate conveying chamber 200A includes a process chamber 201 housing the substrate processing device 40 of FIG. 6, a process chamber 202 housing the MOCVD device 60 of FIG. 4, a process chamber 203 housing the plasma nitriding device 100 of FIGS. 5A and 5B, and a process chamber 104 housing a heat treatment device not shown in the drawings in a connected manner. On the other hand, the vacuum substrate conveying chamber 200B includes a fifth process chamber 205 housing a PVD device depositing a gate electrode of a p-channel MOS transistor on the high-dielectric film 13N of FIG. 4(E) and a sixth process chamber 206 housing a PVD device depositing a gate electrode of an n-channel MOS transistor in a connected manner.

Further, the cluster-type substrate processing system 200 of FIG. 9 has a control device 250 constructed using computer so as to control an entire operation.

The substrate to be processed which is introduced to the load lock chamber 200L is successively conveyed to the process chambers 201 to 204, so that the steps of FIGS. 3B to 3E are performed. The substrate is further sent to the process chamber 205 or 206, so that a metal film constituting the gate electrode is formed on the high-dielectric film 13N.

In the present invention, the control device 250 is programmed to control substrate conveyance such that the process in the process chamber 204 to be performed on the substrate to be processed following the process in the process chamber 203 is started within 30 seconds after the process in the process chamber 203 is ended.

Figure 10:
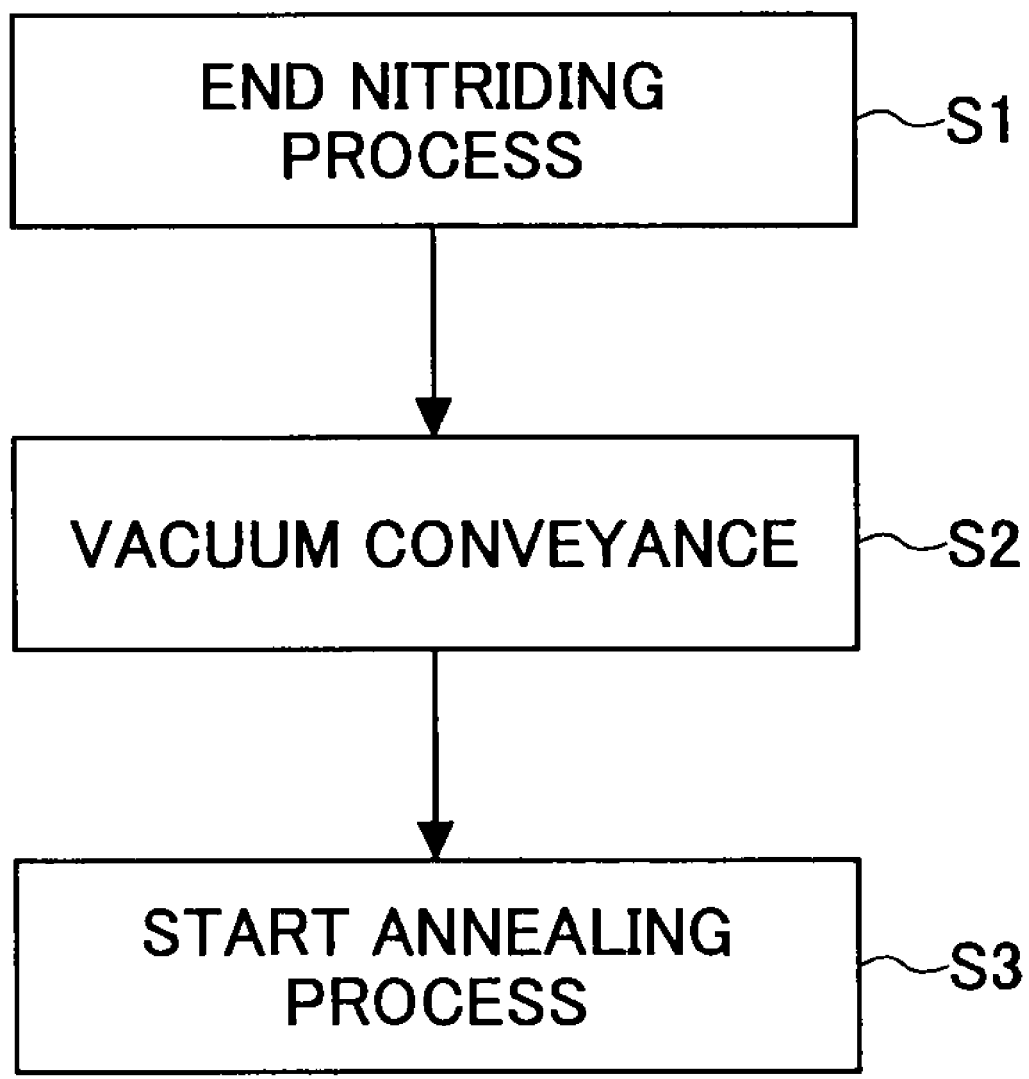
FIG. 10 is a flowchart showing steps of processing a substrate according to a first embodiment of the present invention using the substrate processing device of FIG. 9.

FIG. 10 is a flowchart showing a control operation of the substrate processing system 200 performed by the control device 250 when a recipe for the heat treatment in the process chamber 204 is constructed such that process time of the heat treatment in the process chamber 204 is shorter than that of the nitriding treatment in the process chamber 203 or when a recipe for the nitriding treatment in the process chamber 203 is constructed such that the process time of the heat treatment in the process chamber 204 is longer than that of the nitriding treatment in the process chamber 203. However, FIG. 10 shows only a portion relating to the processes in the process chambers 203 and 204.

Figure 11:
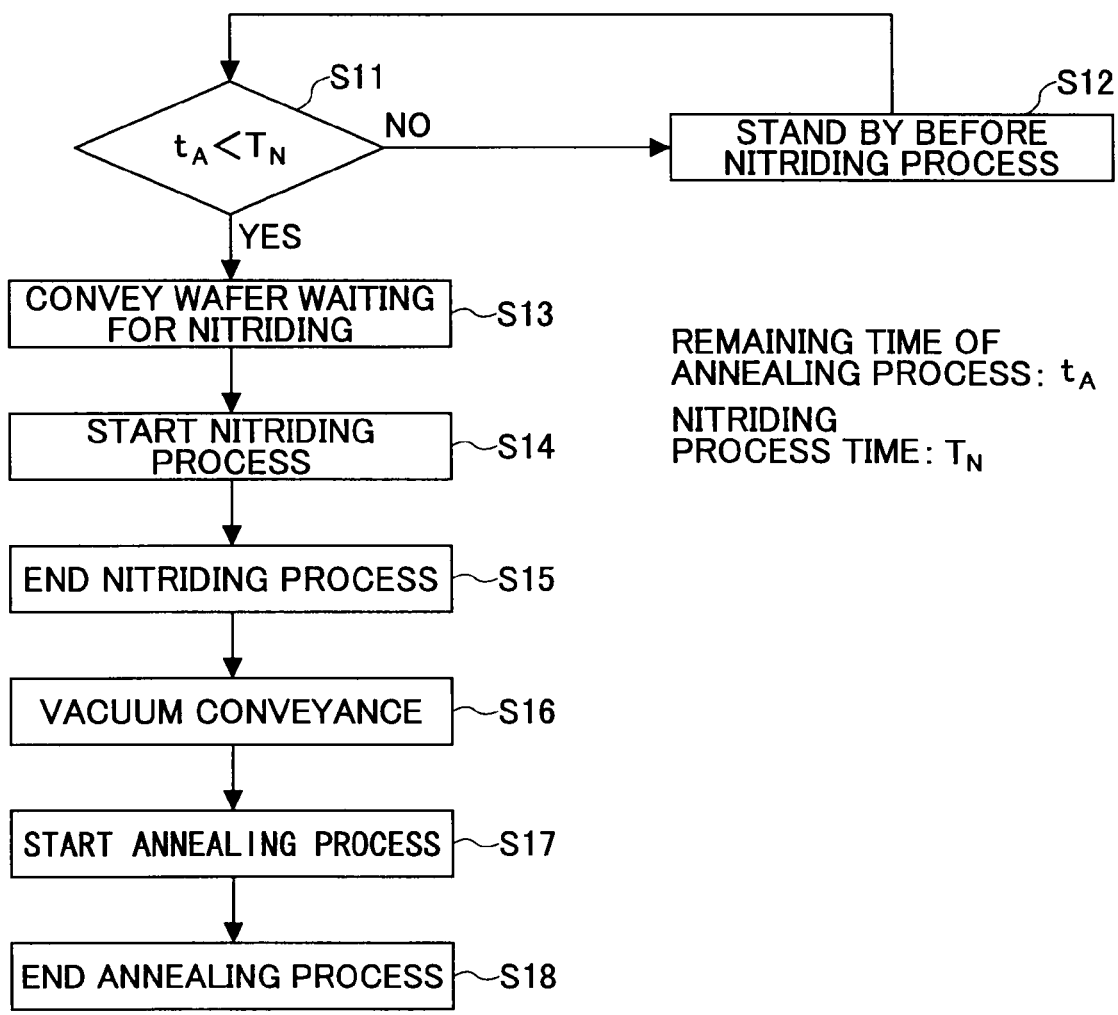
FIG. 11 is a flowchart showing steps of processing a substrate according to a second embodiment of the present invention using the substrate processing device of FIG. 9.

With reference to FIG. 11, in this case, the process time in the process chamber 204 is shorter than the process time in the process chamber 203, so that the substrate to be processed after the nitriding treatment of FIG. 3D in the process chamber 203 is ended in step 1 is immediately conveyed to the process chamber 204 via the vacuum substrate conveying chamber 200A in step 2 and the heat treatment of FIG. 3E is started in the process chamber 204.

Second Embodiment

By contrast, FIG. 11 is a flowchart showing a control operation performed by the control device 250 according to a second embodiment of the present invention, where the process time of the heat treatment in the process chamber 204 is longer than that of the nitriding treatment in the process chamber 203.

With reference to FIG. 11, while substrates to be processed are successively processed one by one in the cluster-type substrate processing system 200 shown in FIG. 9, when the step of FIG. 3C is ended for one substrate to be processed, before this substrate to be processed is conveyed to the process chamber 203 and the nitriding treatment is started, in stap 11, whether remaining time $t_A$ for processing the substrate to be processed being currently subjected to the heat treatment in the process chamber 204 is smaller than nitriding treatment time $T_N$ for the one substrate to be processed in the process chamber 203 is judged. If a judgment result of step 11 is NO, when the one substrate to be processed is immediately conveyed to the process chamber 203 so as to perform the nitriding treatment, the one substrate to be processed after the nitriding treatment in the process chamber 203 must wait for the heat treatment in the process chamber 204 until the processing of the previous substrate to be processed in the process chamber 204 is ended. In this case, when the waiting period exceeds 30 seconds, as mentioned above, the nitrogen atoms introduced in the nitriding treatment in the process chamber 203 may be desorbed.

In view of this, in the present embodiment, the one substrate to be processed is made to stand by before the process chamber 203, namely, in the vacuum substrate conveying chamber 200A or in the process chamber 202, for example, until the remaining time $t_A$ for processing the previous substrate to be processed in the process chamber 204 becomes shorter than the nitriding treatment time $T_N$ in the process chamber 203 (step 12).

On the other hand, in step 11, if the remaining processing time $t_A$ is judged to be smaller than the nitriding treatment time $T_N$, the one substrate to be processed is not required to be made to stand by before the process chamber 204 even when the one substrate to be processed is immediately subjected to the nitriding treatment in the process chamber 203. Thus, the one substrate to be processed is conveyed to the process chamber 103 via the vacuum substrate conveying chamber 200A in step 13 and the nitriding treatment step of FIG. 3D is started in step 14.

After the time $T_N$ has elapsed, the nitriding treatment step is ended in step 15 and the one substrate to be processed is immediately conveyed to the process chamber 204 via the vacuum substrate conveying chamber 200A in step 16. At the time of step 16, the previous substrate to be processed has been already carried out from the process chamber 204.

Further, in step 17, the heat treatment of FIG. 3E is started and the heat treatment is ended after the time $T_N$ has elapsed.

In this manner, in the embodiment illustrated in FIG. 11, if the waiting is expected to be generated for the substrate to be processed before the heat treatment step in the process chamber 204, the substrate to be processed is not made to stand by while being subjected to the nitriding treatment but made to stand by before the nitriding treatment, so that it is possible to prevent the problem where the nitrogen atoms introduced to the high-dielectric film by the nitriding treatment are desorbed during the waiting period.

Figure 2A:
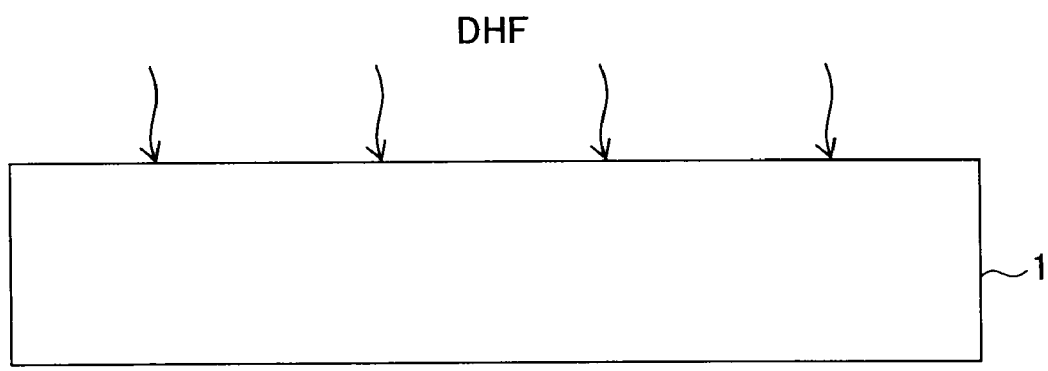
FIG. 2A is a diagram showing a (first) step of forming a high dielectric film according to another technique related to the present invention.
Figure 2B:
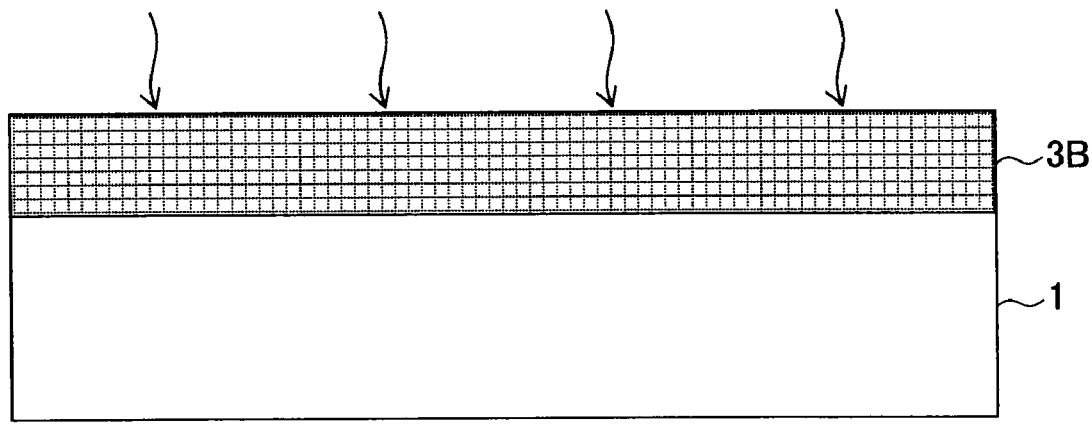
FIG. 2B is a diagram showing a (second) step of forming a high dielectric film according to another technique related to the present invention.

In addition, in the above-mentioned description, as shown in FIGS. 3A to 3E, the HfSiON film is formed by the MOCVD method employing the HTB and TEOS as materials and the film is subjected to the nitriding treatment and heat treatment. However, the present invention is not limited to such a specific film formation method. For example, by applying the present invention to a case where the $HfSiO_4$ film formed in the steps of FIGS. 2A and 2B is subjected to the heat treatment, it is possible to reduce the desorption of nitrogen atoms from the HfSiON film formed by the nitriding treatment.

Further, the present invention is not limited to the HfSiON film but is effective in reducing the desorption of nitrogen atoms introduced by the nitriding treatment in a ZrSiON film, YON film, NaON film, YSiON film, LaSiON film, HfON film, ZrSiON film, ZrON film, and the like.

Third Embodiment

Figure 12:
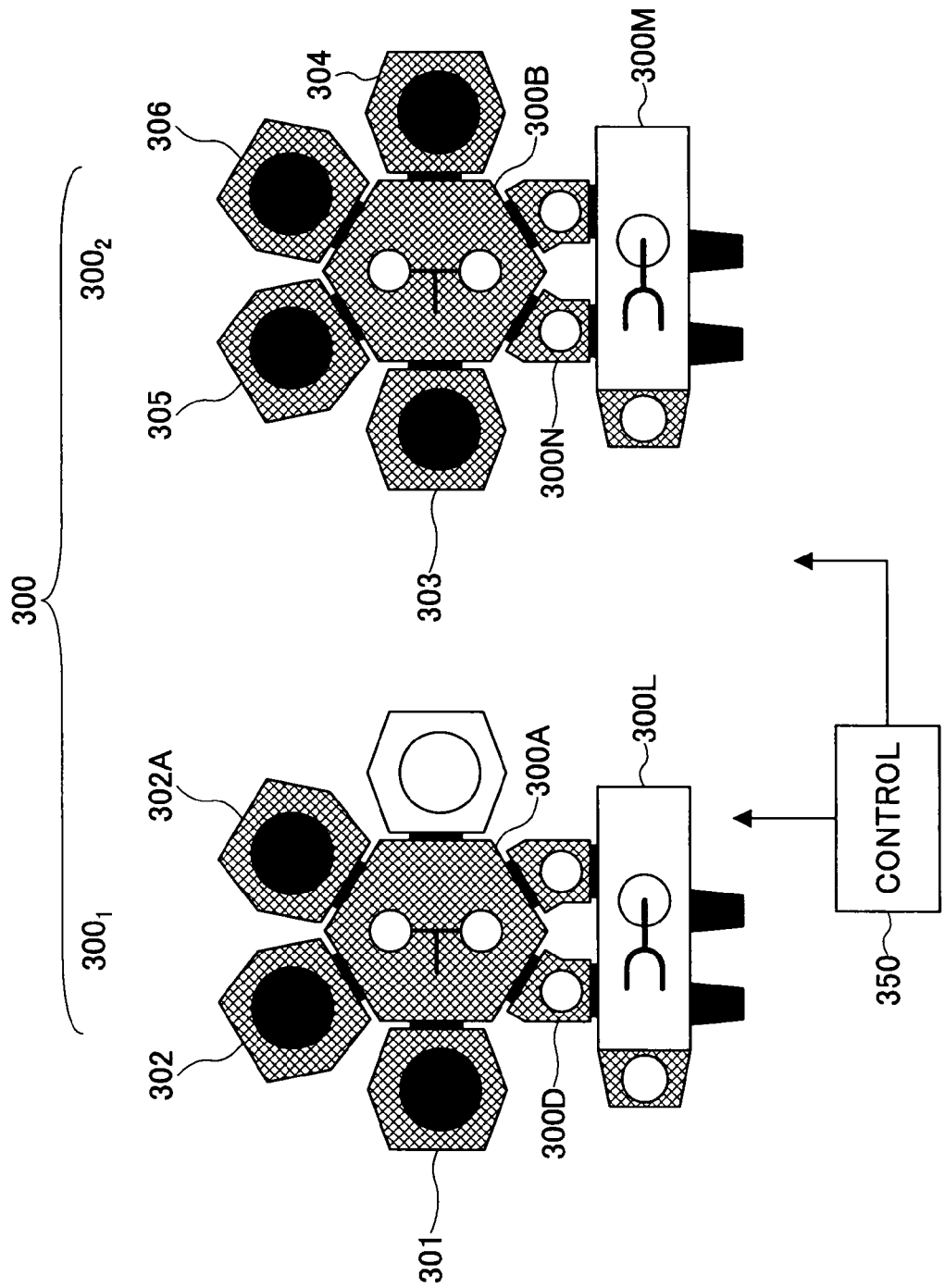
FIG. 12 is a diagram showing a structure of a substrate processing device according to a third embodiment of the present invention.

FIG. 12 is a diagram showing a structure of a substrate processing device 300 according to a third embodiment of the present invention. In FIG. 12, the same reference numerals are assigned to portions corresponding to the portions described above and description thereof is omitted.

With reference to FIG. 12, the substrate processing device 300 is constructed using two single wafer substrate processing devices $300_1$ and $300_2$. In the substrate processing device $300_1$, process chambers 301 and 302 corresponding to the process chambers 201 and 202, respectively, are disposed on a vacuum substrate conveying chamber 300A corresponding to the vacuum substrate conveying chamber 200A in a connected manner. Further, in the vacuum substrate conveying chamber 300A, a load lock chamber 300L corresponding to the load lock chamber 200L is connected thereto via a vacuum conveying chamber 300D corresponding to the vacuum conveying chamber 200D. Moreover, in the example shown in FIG. 13, in the vacuum substrate conveying chamber 300A, another process chamber 302A is disposed for the heat treatment of a high-dielectric film formed in the process chamber 302. The process chamber 302A may be omitted.

On the other hand, in the substrate processing device $300_2$, process chambers 303 to 306 corresponding to the process chambers 203 to 206, respectively, are disposed on a vacuum substrate conveying chamber 300B corresponding to the vacuum substrate conveying chamber 200B in a connected manner. Further, in the vacuum substrate conveying chamber 300B, a load lock chamber 300M is connected thereto via a vacuum conveying chamber 300N. In the same manner as in the above-mentioned embodiment, the process chambers 305 and 306 are disposed so as to form a gate electrode film of a p-type MOS transistor and a gate electrode film of an n-type MOS transistor, respectively. In accordance with this, upon processing one substrate to be processed, only one of the process chambers is used.

In addition, the process chambers 301 to 306 in the substrate processing device 300 are each operated at an operation rate of 90% which is smaller than 100%, for example, for maintenance sake or the like. Accordingly, in a substrate processing device having a structure as shown in FIG. 9 where five process chambers performing a series of successive steps, such as the process chambers 201 to 205 or the process chambers 201 to 204 and 206, are connected in series, even when the operation rate of each process chamber is 90%, an entire operation rate becomes 59% ($0.9^5$=0.59), so that the operation rate of an entire substrate processing device is reduced.

By contrast, in a substrate processing device having a structure as shown in FIG. 12 where the processing device is divided into the two portions $300_1$ and $300_2$ and a number of the process chambers connected to a single vacuum substrate conveying chamber and performing a series of successive steps is reduced, the operation rate of the substrate processing device $300_1$ is 73% ($0.9^3$=0.73) in accordance with the series connection of the process chambers 301 to 302A when the process chambers are used up to the process chamber 302A. Further, when the process chamber 302A is not used, the operation rate becomes 81% ($0.9^2$=0.81) in accordance with the series connection of the process chambers 301 and 302. On the other hand, in the substrate processing device $300_2$, the operation rate is 73% ($0.9^3$=0.73) in accordance with the series connection of process chambers 303 to 305 or 303 to 304 and 306, so that an entire operation rate becomes 73% equal to the operation rate of the substrate processing device $300_2$.

In other words, in accordance with the structure of FIG. 12, it is possible to improve the operation rate of the substrate processing device performing the steps of FIG. 3A to 3E.

In the embodiment shown in FIG. 12, the substrate processing devices $300_1$ and $300_2$ are also controlled by a control device 350 which is the same as the control device 250 used in the substrate processing device 200 of FIG. 10.

Fourth Embodiment

Figure 13:
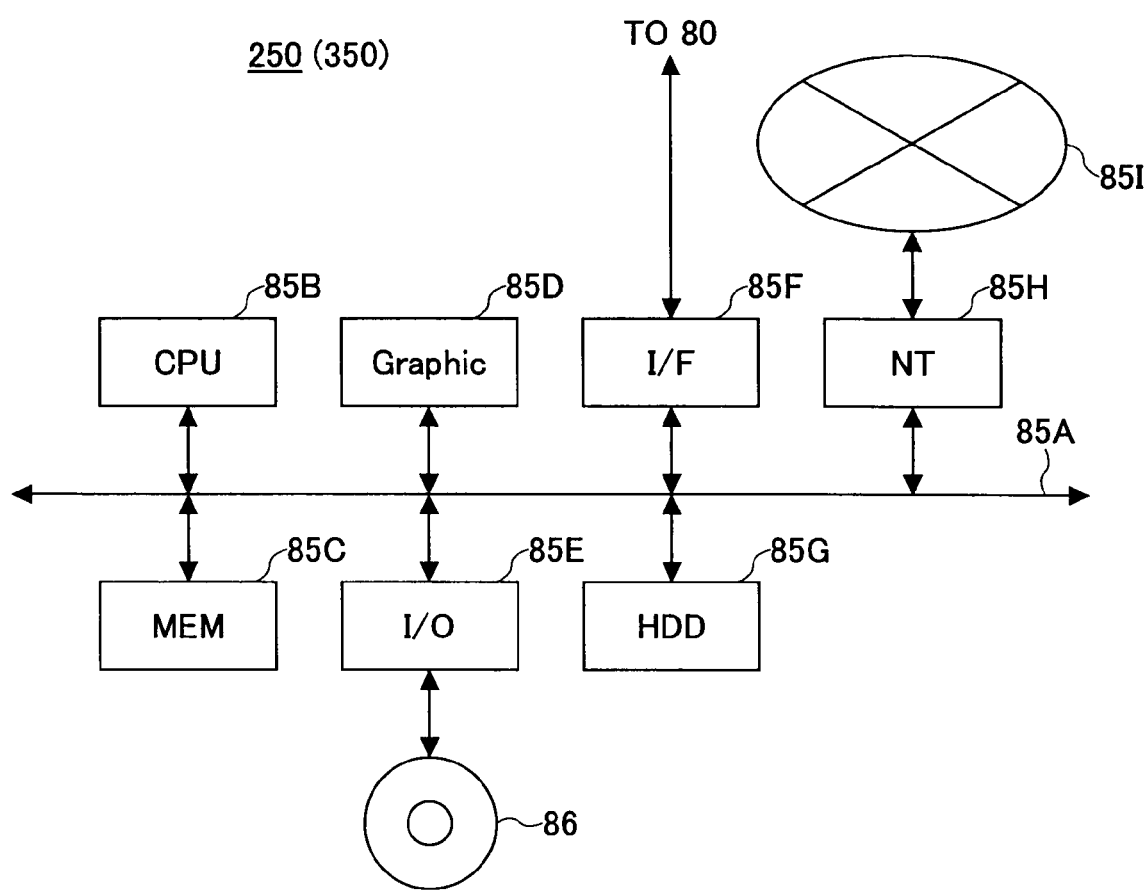
FIG. 13 is a diagram showing a structure of a control device according to a fourth embodiment of the present invention.

FIG. 13 schematically shows a structure of the control device 250 or the control device 350. Although the control device 250 is described in the following, the control device 350 has the same structure.

With reference to FIG. 13, the control device 250 includes a system bus 85A. A CPU 85B, memory unit 85C, graphic card 85D, input/output device 85E, interface card 85F, hard disk unit 85G, network controller 85H, and the like are connected to the system bus 85A, and the control device 250 controls the cluster-type substrate processing device 200 via the interface card 85F.

In particular, under control by the CPU 85B, the input/output device 85E reads a magnetic storage medium or an optical storage medium in which a control program code is recorded and extracts the control program on the memory unit 85C or the hard disk 85G. Further, the CPU successively executes the control program extracted in this manner and controls the cluster-type substrate processing system 200 via the interface card.

Moreover, it is possible to download the control program from a network 85I via the network controller 85H.

The present invention is not limited to the specifically disclosed embodiment, and variations and modifications may be made without departing from the scope of the present invention.

The present application is based on Japanese priority application No. 2006-128564 filed May 2, 2006, the entire contents of which are hereby incorporated herein by reference.

The invention claimed is:

1. A substrate processing method in a single wafer substrate processing device including a first process position for introducing nitrogen atoms to a high-dielectric film and a second process position for performing heat treatment on the high-dielectric film, said substrate processing method comprising:
   successively conveying plural substrates to be processed to said first process position and said second process position one by one; and
   successively performing the introduction of nitrogen atoms and the heat treatment on the high-dielectric film on the substrates to be processed, wherein
   the treatment on the substrate to be processed is started within 30 seconds at said second process position after the process at said first position.

2. The substrate processing method according to claim 1, wherein
   process time at said second process position is shorter than process time at said first process position.

3. The substrate processing method according to claim 1, wherein
   when a previous substrate to be processed is being processed at said second process position and remaining time for processing the previous substrate to be processed at said second process position is equal to or longer than process time for a next substrate to be processed at said first process position, said single wafer substrate processing device causes the next substrate to be processed to stand by before said first process position.

4. The substrate processing method according to claim 3, wherein
   the next substrate to be processed is caused to stand by in a vacuum substrate conveying chamber connected to said first and second process positions.

5. The substrate processing method according to claim 1, wherein
   when a previous substrate to be processed is being processed at said second process position and remaining time for processing the previous substrate to be processed at said second process position is equal to or longer than process time for a next substrate to be processed at said first process position, said single wafer substrate processing device causes the next substrate to be processed to stand by at said first process position.

* * * * *